(12) United States Patent
Nongpiur et al.

(10) Patent No.: US 7,716,046 B2
(45) Date of Patent: May 11, 2010

(54) ADVANCED PERIODIC SIGNAL ENHANCEMENT

(75) Inventors: Rajeev Nongpiur, Burnaby (CA); Phillip A. Heterington, Port Moody (CA)

(73) Assignee: QNX Software Systems (Wavemakers), Inc., Vancouver, British Columbia (CA)

( * ) Notice: Subject to any disclaimer, the term of this patent is extended or adjusted under 35 U.S.C. 154(b) by 1171 days.

(21) Appl. No.: 11/317,762

(22) Filed: Dec. 23, 2005

(65) Prior Publication Data

US 2006/0136199 A1  Jun. 22, 2006

Related U.S. Application Data

(63) Continuation-in-part of application No. 10/973,575, filed on Oct. 26, 2004.

(51) Int. Cl.
G10L 21/02 (2006.01)
H04B 15/00 (2006.01)

(52) U.S. Cl. ................................. 704/226; 381/94.1

(58) Field of Classification Search ............ 704/200, 704/201, 226, 233; 381/71.1, 94.1, 94.2
See application file for complete search history.

(56) References Cited

U.S. PATENT DOCUMENTS

| | | |
|---|---|---|
| 4,282,405 A | 8/1981 | Taguchi |
| 4,486,900 A | 12/1984 | Cox et al. ............ 381/38 |
| 4,531,228 A | 7/1985 | Noso et al. |
| 4,628,156 A | 12/1986 | Irvin |
| 4,630,305 A | 12/1986 | Borth et al. |
| 4,791,390 A | 12/1988 | Harris et al. |
| 4,811,404 A | 3/1989 | Vilmur et al. |
| 4,843,562 A | 6/1989 | Kenyon et al. |
| 4,939,685 A | 7/1990 | Feintuch |
| 4,969,192 A | 11/1990 | Chen et al. |
| 5,027,410 A | 6/1991 | Williamson et al. |
| 5,056,150 A | 10/1991 | Yu et al. |
| 5,146,539 A | 9/1992 | Doddington et al. |
| 5,278,780 A | 1/1994 | Eguchi et al. |

(Continued)

FOREIGN PATENT DOCUMENTS

CA  2158847  9/1994

(Continued)

OTHER PUBLICATIONS

Tam et al, "Highly Oversampled Subband Adaptive Filters for Noise Cancellation on a Low-resource DSP System", Proc. of Int. Conf. on Spoken Language Processing (ICSLP), Sep. 2002, pp. 1-4.*

(Continued)

*Primary Examiner*—James S Wozniak
(74) *Attorney, Agent, or Firm*—Brinks Hofer Gilson & Lione

(57) ABSTRACT

An enhancement system improves the perceptual quality of a processed speech. The system includes a delay unit that delays a signal received through a discrete input. A spectral modifier linked to the delay unit is programmed to substantially flatten the spectral character of a background noise. An adaptive filter linked to the spectral modifier adapts filter characteristics to match a response of a non-delayed signal. A programmable filter is linked to the delay unit. The programmable filter has a transfer function functionally related to a transfer function of the adaptive filter.

23 Claims, 14 Drawing Sheets

U.S. PATENT DOCUMENTS

| | | | |
|---|---|---|---|
| 5,313,555 A | 5/1994 | Kamiya | |
| 5,377,276 A * | 12/1994 | Terai et al. | 381/71.11 |
| 5,400,409 A | 3/1995 | Linhard | |
| 5,406,622 A * | 4/1995 | Silverberg et al. | 381/94.7 |
| 5,412,735 A * | 5/1995 | Engebretson et al. | 704/E21.004 |
| 5,432,859 A * | 7/1995 | Yang et al. | 704/203 |
| 5,473,702 A * | 12/1995 | Yoshida et al. | 381/94.7 |
| 5,479,517 A | 12/1995 | Linhard | |
| 5,494,886 A | 2/1996 | Kehne et al. | |
| 5,495,415 A | 2/1996 | Ribbens et al. | |
| 5,502,688 A | 3/1996 | Recchione et al. | |
| 5,526,466 A | 6/1996 | Takizawa | |
| 5,568,559 A | 10/1996 | Makino | |
| 5,572,262 A | 11/1996 | Ghosh | |
| 5,584,295 A | 12/1996 | Muller et al. | 128/661.07 |
| 5,590,241 A | 12/1996 | Park et al. | |
| 5,615,298 A | 3/1997 | Chen | |
| 5,617,508 A | 4/1997 | Reaves | |
| 5,641,931 A | 6/1997 | Ogai et al. | |
| 5,677,987 A | 10/1997 | Seki et al. | |
| 5,680,508 A | 10/1997 | Liu | |
| 5,692,104 A | 11/1997 | Chow et al. | |
| 5,701,344 A | 12/1997 | Wakui | |
| 5,714,997 A | 2/1998 | Anderson | |
| 5,742,694 A * | 4/1998 | Eatwell | 381/94.2 |
| 5,819,215 A | 10/1998 | Dobson et al. | |
| 5,845,243 A | 12/1998 | Smart et al. | |
| 5,920,840 A | 7/1999 | Satyamurti et al. | |
| 5,920,848 A | 7/1999 | Schutzer et al. | |
| 5,933,801 A | 8/1999 | Fink et al. | |
| 5,949,886 A | 9/1999 | Nevins et al. | |
| 5,949,888 A | 9/1999 | Gupta et al. | |
| 5,953,694 A | 9/1999 | Pillekamp | |
| 6,011,853 A | 1/2000 | Koski et al. | |
| 6,084,907 A | 7/2000 | Nagano et al. | |
| 6,111,957 A | 8/2000 | Thomasson | |
| 6,144,336 A | 11/2000 | Preston et al. | |
| 6,163,608 A | 12/2000 | Romesburg et al. | |
| 6,167,375 A | 12/2000 | Miseki et al. | |
| 6,173,074 B1 | 1/2001 | Russo | |
| 6,175,602 B1 | 1/2001 | Gustafsson et al. | |
| 6,192,134 B1 | 2/2001 | White et al. | |
| 6,199,035 B1 | 3/2001 | Lakaniemi et al. | 704/207 |
| 6,219,418 B1 * | 4/2001 | Eriksson et al. | 379/406.08 |
| 6,249,275 B1 | 6/2001 | Kodama | |
| 6,282,430 B1 | 8/2001 | Young | |
| 6,405,168 B1 | 6/2002 | Bayya et al. | |
| 6,408,273 B1 | 6/2002 | Quagliaro et al. | |
| 6,434,246 B1 | 8/2002 | Kates et al. | |
| 6,473,409 B1 | 10/2002 | Malvar | |
| 6,493,338 B1 | 12/2002 | Preston et al. | |
| 6,507,814 B1 | 1/2003 | Gao | 704/220 |
| 6,587,816 B1 | 7/2003 | Chazan et al. | 704/207 |
| 6,633,894 B1 | 10/2003 | Cole | |
| 6,643,619 B1 | 11/2003 | Linhard et al. | |
| 6,687,669 B1 | 2/2004 | Schrögmeier et al. | |
| 6,690,681 B1 | 2/2004 | Preston et al. | |
| 6,725,190 B1 | 4/2004 | Cohen et al. | |
| 6,771,629 B1 | 8/2004 | Preston et al. | |
| 6,782,363 B2 | 8/2004 | Lee et al. | |
| 6,804,640 B1 | 10/2004 | Weintraub et al. | |
| 6,822,507 B2 | 11/2004 | Buchele | |
| 6,836,761 B1 | 12/2004 | Kawashima et al. | |
| 6,859,420 B1 | 2/2005 | Coney et al. | |
| 6,871,176 B2 | 3/2005 | Choi et al. | |
| 6,891,809 B1 | 5/2005 | Ciccone et al. | |
| 6,898,293 B2 | 5/2005 | Kaulberg | |
| 6,910,011 B1 | 6/2005 | Zakarauskas | |
| 6,937,978 B2 * | 8/2005 | Liu | 704/228 |
| 7,020,291 B2 | 3/2006 | Buck et al. | |
| 7,117,149 B1 | 10/2006 | Zakarauskas | |
| 7,146,012 B1 | 12/2006 | Belt et al. | |
| 7,146,316 B2 | 12/2006 | Alves | |
| 7,167,516 B1 | 1/2007 | He | |
| 7,167,568 B2 * | 1/2007 | Malvar et al. | 381/66 |
| 7,206,418 B2 * | 4/2007 | Yang et al. | 381/92 |
| 7,231,347 B2 | 6/2007 | Zakarauskas | |
| 7,269,188 B2 | 9/2007 | Smith | |
| 7,272,566 B2 | 9/2007 | Vinton | |
| 2001/0005822 A1 * | 6/2001 | Fujii et al. | 704/200 |
| 2001/0028713 A1 | 10/2001 | Walker | |
| 2002/0052736 A1 | 5/2002 | Kim et al. | |
| 2002/0071573 A1 | 6/2002 | Finn | |
| 2002/0176589 A1 | 11/2002 | Buck et al. | |
| 2003/0040908 A1 | 2/2003 | Yang et al. | |
| 2003/0093265 A1 | 5/2003 | Xu et al. | |
| 2003/0093270 A1 | 5/2003 | Domer | |
| 2003/0101048 A1 | 5/2003 | Liu | |
| 2003/0206640 A1 | 11/2003 | Malvar et al. | |
| 2003/0216907 A1 | 11/2003 | Thomas | |
| 2004/0002856 A1 | 1/2004 | Bhaskar et al. | |
| 2004/0024600 A1 | 2/2004 | Hamza et al. | |
| 2004/0071284 A1 * | 4/2004 | Abutalebi et al. | 379/406.08 |
| 2004/0078200 A1 | 4/2004 | Alves | |
| 2004/0138882 A1 | 7/2004 | Miyazawa | |
| 2004/0165736 A1 | 8/2004 | Hetherington et al. | |
| 2004/0167777 A1 | 8/2004 | Hetherington et al. | |
| 2004/0179610 A1 | 9/2004 | Lu et al. | |
| 2005/0075866 A1 * | 4/2005 | Widrow | 704/211 |
| 2005/0114128 A1 | 5/2005 | Hetherington et al. | |
| 2005/0240401 A1 | 10/2005 | Ebenezer | |
| 2006/0034447 A1 | 2/2006 | Alves et al. | |
| 2006/0056502 A1 | 3/2006 | Callicotte | |
| 2006/0074646 A1 | 4/2006 | Alves et al. | |
| 2006/0089959 A1 | 4/2006 | Nongpiur et al. | |
| 2006/0100868 A1 | 5/2006 | Hetherington et al. | |
| 2006/0115095 A1 | 6/2006 | Giesbrecht et al. | |
| 2006/0116873 A1 | 6/2006 | Hetherington et al. | |
| 2006/0251268 A1 | 11/2006 | Hetherington et al. | |
| 2006/0287859 A1 | 12/2006 | Hetherington et al. | |
| 2007/0033031 A1 | 2/2007 | Zakarauskas | |
| 2007/0136055 A1 | 6/2007 | Hetherington | |

FOREIGN PATENT DOCUMENTS

| | | |
|---|---|---|
| CA | 2157496 | 10/1994 |
| CA | 2158064 | 10/1994 |
| EP | 0 076 687 A1 | 4/1983 |
| EP | 0 275 416 | 7/1988 |
| EP | 0 629 996 A2 | 12/1994 |
| EP | 0 629 996 A3 | 12/1994 |
| EP | 0 750 291 A1 | 12/1996 |
| EP | 1 450 353 A1 | 8/2004 |
| EP | 1 450 354 A1 | 8/2004 |
| EP | 1 669 983 A1 | 6/2006 |
| JP | 06269084 A2 | 9/1994 |
| JP | 06319193 A | 11/1994 |
| WO | WO 00-41169 A1 | 7/2000 |
| WO | WO 0156255 A1 | 8/2001 |
| WO | WO 01-73761 A1 | 10/2001 |

OTHER PUBLICATIONS

Kang, Hae-Dong; "Voice Enhancement Using a Single Input Adaptive Noise Elimination Technique Having a Recursive Time-Delay Estimator", Kyungbook National University (Korea), Doctoral Thesis, Dec. 31, 1993, pp. 11-26.

Pornimitkul, P. et al., 2102797 Statistic Digital Signal Processing, Comparison of NLMS and RLS for Acoustic Echo Cancellation (AEC) and White Gaussian Noise (WGN), Department of Electrical Engineering Faculty of Engineering, 2002, pp. 1-19.

Bilcu, et al., "A New Variable Length LMS Algorithm: Theoretical Analysis and Implementations", 2002 IEEE, pp. 1031-1034.

Nascimento, Vitor H., "Improving the Initial Convergence Of Adaptive Filters" Variable-Length LMS Algorithms, 2002 IEEE, pp. 667-670.

Kauppinen, I., "Methods for Detecting Impulsive Noise in Speech and Audio Signals", pp. 967-970, IEEE 2002.

Vaseghi, S. et al., "The Effects of Non-Stationary Signal Characteristics on the Performance of Adaptive Audio Restoration System", pp. 377-380, IEEE 1989.

The prosecution history of U.S. Appl. No. 10/973,575 shown in the attached Patent Application Retrieval file wrapper document list, printed Dec. 30, 2008, including any substantive Office Actions and Applicant Responses.

The prosecution history of U.S. Appl. No. 11/101,796 shown in the attached Patent Application Retrieval file wrapper document list, printed Dec. 12, 2008, including any substantive Office Actions and Applicant Responses.

The prosecution history of U.S. Appl. No. 11/102,251 shown in the attached Patent Application Retrieval file wrapper document list, printed Dec. 12, 2008, including any substantive Office Actions and Applicant Responses.

The prosecution history of U.S. Appl. No. 11/298,052 shown in the attached Patent Application Retrieval file wrapper document list, printed Dec. 30, 2008, including any substantive Office Actions and Applicant Responses.

The prosecution history of U.S. Appl. No. 11/757,768 shown in the attached Patent Application Retrieval file wrapper document list, printed Nov. 21, 2008, including any substantive Office Actions and Applicant Responses.

The prosecution history of U.S. Appl. No. 11/849,009 shown in the attached Patent Application Retrieval file wrapper document list, printed Nov. 21, 2008, including any substantive Office Actions and Applicant Responses.

Koike, Shiin'ichi, "Adaptive Threshold Nonlinear Algorithm for Adaptive Filters with Robustness Against Impulse Noise," 1996, IEEE, NEC Corporation, Tokyo 108-01, pp. 1644-1647.

Anderson C.M., et al; "Adaptive Enhancement of Finite Bandwidth Signals in White Gaussian Noise", *IEEE Trans. On Acoustics, Speech and Signal Processing*, vol. ASSP-31, No. 1, Feb. 1983, pp. 17-28.

Chang J.H., et al: "Pitch Estimation of Speech Signal Based on Adaptive Lattice Notch Filter", *Signal Processing*, Elsevier Science Publishers B.V. Amsterdam, NL, vol. 85, No. 3, Mar. 2005, pp. 637-641.

Rabiner L.R., et al: "A Comparative Performance Study of Several Pitch Detection Algorithms", *IEEE Trans. On Acoustics, Speech and Signal Processing*, vol. ASSP-24, No. 5, Oct. 1976, pp. 399-418.

Byun K.J., et al: "Noise Whitening-Based Pitch Detection for Speech Highly Corrupted by Colored Noise", *ETRI Journal*, vol. 25, No. 1, Feb. 2003, pp. 49-51.

Campbell D.A., et al: "Dynamic Weight Leakage for LMS Adaptive Linear Predictors", *Tencon '96 Proceedings*, 1996 IEEE Tencon Digital Signal Processing Applications Perth, WA, Australia Nov. 26-29, 1996, NY, NY, USA, IEEE, US, vol. 2, Nov. 26, 1996, pp. 574-579.

Sasaoka N, et al: "A New Noise Reduction System Based on ALE and Noise Reconstruction Filter", *Circuits and Systems*, 2005. ISCAS 2005. IEEE International Symposium on KOBE, Japan May 23-26, 2005, Piscataway, NJ USA, IEEE May 23, 2005, pp. 272-275.

Avendano, C., Hermansky, H., "Study on the Dereverberation of Speech Based on Temporal Envelope Filtering," Proc. ICSLP '96, pp. 889-892, Oct. 1996.

Berk et al., "Data Analysis with Microsoft Excel", Duxbury Press, 1998, pp. 236-239 and 256-259.

Fiori, S., Uncini, a., and Piazza, F., "Blind Deconvolution by Modified Bussgang Algorithm", Dept. of Electronics and Automatics—University of Ancona (Italy), ISCAS 1999.

Learned, R.E. et al., A Wavelet Packet Approach to Transient Signal Classification, Applied and Computational Harmonic Analysis, Jul. 1995, pp. 265-278, vol. 2, No. 3, USA, XP 000972660. ISSN: 1063-5203. abstract.

Nakatani, T., Miyoshi, M., and Kinoshita, K., "Implementation and Effects of Single Channel Dereverberation Based on the Harmonic Structure of Speech," Proc. of IWAENC-2003, pp. 91-94, Sep. 2003.

Puder, H. et al., "Improved Noise Reduction for Hands-Free Car Phones Utilizing Information on a Vehicle and Engine Speeds", Sep. 4-8, 2000, pp. 1851-1854, vol. 3, XP009030255, 2000. Tampere, Finland, Tampere Univ. Technology, Finland Abstract.

Quatieri, T.F. et al., Noise Reduction Using a Soft-Dection/Decision Sine-Wave Vector Quantizer, International Conference on Acoustics, Speech & Signal Processing, Apr. 3, 1990, pp. 821-824, vol. Conf. 15, IEEE ICASSP, New York, US XP000146895, Abstract, Paragraph 3.1.

Quelavoine, R. et al., Transients Recognition in Underwater Acoustic with Multilayer Neural Networks, Engineering Benefits from Neural Networks, Proceedings of the International Conference EANN 1998, Gibraltar, Jun. 10-12, 1998 pp. 330-333, XP 000974500. 1998, Turku, Finland, Syst. Eng. Assoc., Finland. ISBN: 951-97868-0-5. abstract, p. 30 paragraph 1.

Seely, S., "An Introduction to Engineering Systems", Pergamon Press Inc., 1972; pp. 7-10.

Shust, Michael R. and Rogers, James C., Abstract of "Active Removal of Wind Noise From Outdoor Microphones Using Local Velocity Measurements", *J. Acoust. Soc. Am.*, vol. 104, No. 3, Pt 2, 1998, 1 page.

Shust, Michael R. And Rogers, James C., "Electronic Removal of Outdoor Microphone Wind Noise", obtained from the Internet on Oct. 5, 2006 at: <http://www.acoustics.org/press/136th/mshust.htm>, 6 pages.

Simon, G., Detection of Harmonic Burst Signals, International Journal Circuit Theory and Applications, Jul. 1985, vol. 13, No. 3, pp. 195-201, UK, XP 000974305. ISSN: 0098-9886. abstract.

Vieira, J., "Automatic Estimation of Reverberation Time", Audio Engineering Society, Convention Paper 6107, 116th Convention, May 8-11, 2004, Berlin, Germany, pp. 1-7.

Wahab A. et al., "Intelligent Dashboard With Speech Enhancement", Information, Communications, and Signal Processing, 1997. ICICS, Proceedings of 1997 International Conference on Singapore, Sep. 9-12, 1997, New York, NY, USA, IEEE, pp. 993-997.

Zakarauskas, P., Detection and Localization of Nondeterministic Transients in Time series and Application to Ice-Cracking Sound, Digital Signal Processing, 1993, vol. 3, No. 1, pp. 36-45, Academic Press, Orlando, FL, USA, XP 000361270, ISSN: 1051-2004. entire document.

\* cited by examiner

ADVANCED PERIODIC SIGNAL ENHANCEMENT

PRIORITY CLAIM

This application is a continuation-in-part of U.S. application Ser. No. 10/973,575 "Periodic Signal Enhancement System," filed Oct. 26, 2004. The disclosure of the above application is incorporated herein by reference.

BACKGROUND OF THE INVENTION

1. Technical Field

The invention relates to communication systems, and more particularly, to systems that enhance speech.

2. Related Art

Communication devices may acquire, assimilate, and transfer speech signals. Many speech signals may be classified into voiced and unvoiced. In the time domain, unvoiced segments display a noise like structure. Little or no periodicity may be apparent. In the speech spectrum, voiced speech segments have almost a periodic structure.

Some natural speech has a combination of a harmonic spectrum and a noise spectrum. A mixture of harmonics and noise may appear across a large bandwidth. Non-stationary and/or varying levels of noise may be highly objectionable especially when the noise masks voiced segments and non-speech intervals. While the spectral characteristics of non-stationary noise may not vary greatly, its amplitude may vary drastically.

For this reason, there is a need for a system that may strengthen or enhance voiced segments without enhancing non-stationary noise. There is also a need for a system that enhances the periodic like structure of voiced segments in the presence of tonal interference.

SUMMARY

An enhancement system improves the perceptual quality of a processed speech. The system includes a delay unit that delays a signal received through a discrete input. A spectral modifier coupled to the delay unit is programmed to substantially flatten the spectral character of a background noise. An adaptive filter coupled to the spectral modifier adapts filter characteristics to match a response of a non-delayed signal. A programmable filter is linked to the delay unit. The programmable filter has a transfer function functionally related to the transfer function of the adaptive filter.

Other systems, methods, features, and advantages of the invention will be, or will become, apparent to one with skill in the art upon examination of the following figures and detailed description. It is intended that all such additional systems, methods, features, and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Enhancement logic improves the perceptual quality of a processed speech signal. The logic may automatically identify and enhance speech segments without amplifying some or all sensed noise. Selected voiced and/or unvoiced segments may be processed and amplified in one or more frequency bands. To improve perceptual quality, adaptive gain adjustments may be made in the discrete domain. The system may adjust the gain of only some of or the entire speech segments with some adjustments based on a sensed or estimated noise or background noise signal. The versatility of the system allows the enhancement logic to enhance speech before it is passed or processed by a second system. In some applications, speech or other audio signals may be passed to remote, local, or mobile system such as an automatic speech recognition engine that may capture and extract voice in the time, and/or frequency and/or discrete domains.

The enhancement system 100 of FIGS. 1-3 and 8 may interface or comprise a unitary part of a vehicle or a communication system (e.g., a wireless telephone, an automatic speech recognition system, etc). The systems may include preprocessing logic and/or post-processing logic and may be implemented in hardware and/or software. In some systems, software is processed by a Digital Signal Processor "DSP," General Purpose Processor "GPP," or some combination of DSP and GPP. The processor(s) may execute instructions that delay an input signal, track frequency components of a signal, filter a signal, and/or reinforce selected spectral content. In other systems, the hardware or software may be programmed or implemented in discrete logic or circuitry, a combination of discrete and integrated logic or circuitry, and/or may be distributed across and executed by multiple controllers or processors.

Figure 1:
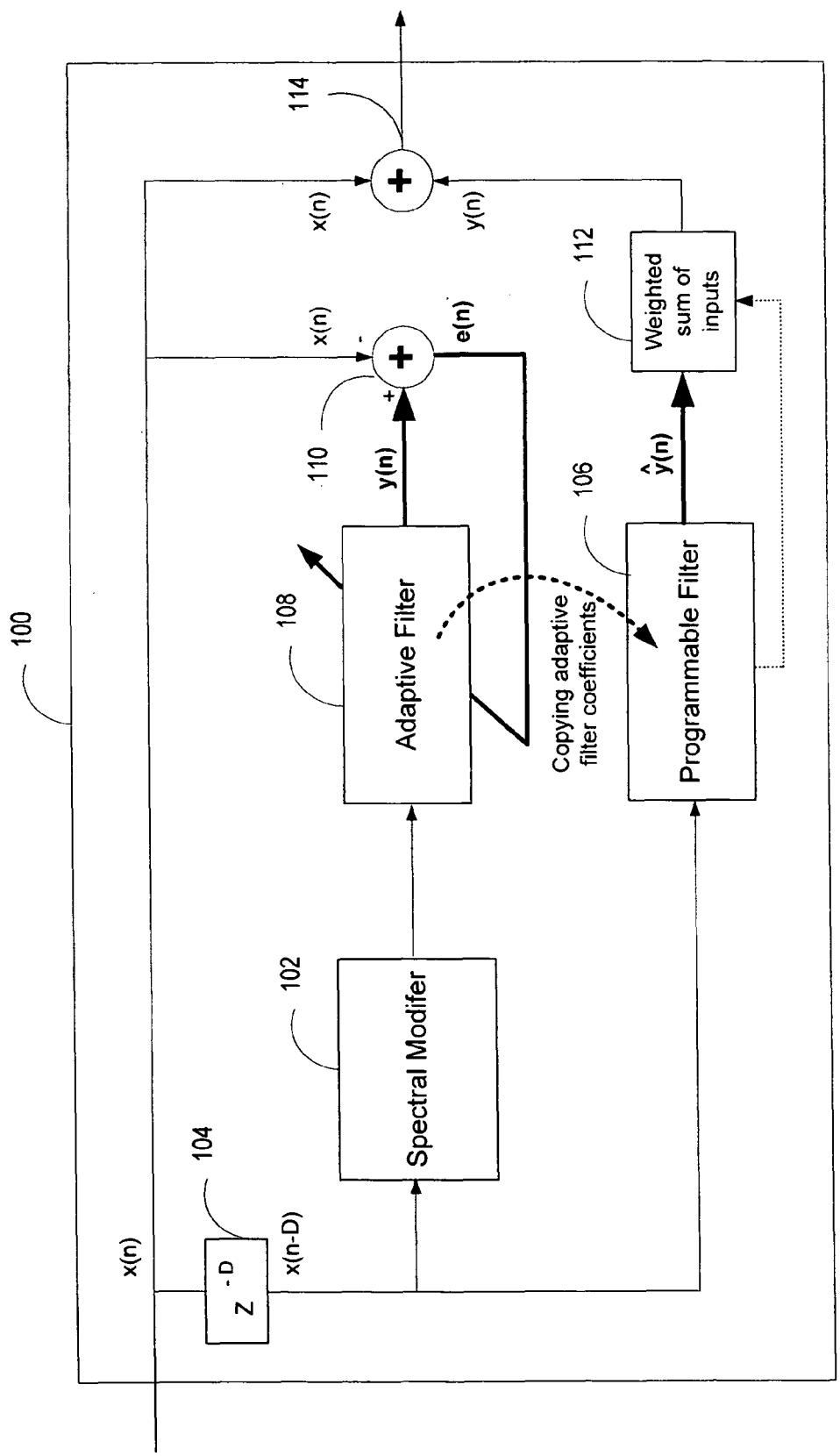
FIG. 1 is a block diagram of an enhancement system.

FIG. 1 is a block diagram of a communication or an enhancement system 100 that includes a spectral modifier 102. As shown, the spectral modifier 102 changes the frequency spectrum of a delayed signal. A digital delay or delay unit 104, which may be implemented by a portion of a memory device or buffer that temporarily holds data to be transferred to another location for a defined or programmable period, couples an input "x(n)" to the spectral modifier 102 and a programmable filter 106 that may have a single input and multiple outputs. The spectral modifier 102 substantially flattens the spectral character of a portion of a detected background noise within the input "x(n)" or the delayed input "x(n–D)" that may include speech and background noise. In some systems the frequency and/or amplitude of portions of the background noise is detected during talk spurts and pauses. In some applications, the detected noise is modeled by an n-pole linear predictive coding "LPC" filter model where n is usually set to 4. In these and other systems, some of the background noise is substantially flattened, and in other systems some of the background noise is dampened. The noise may be dampened to a comfort noise level, noise floor, or a predetermined level that a user expects to hear.

An adaptive filter 108, such as a moving average filter, a nonrecursive discrete-time filter, or an adaptive FIR filter models a portion of the speech spectrum with the flattened or dampened noise spectrum. In some enhancement systems the adaptive filter 108 changes or adapts its coefficients to match as closely as possible or approximate the response of the input signal "x(n)". Using an adaptive filtering algorithm the error signal "e(n)" is derived through adder logic or an adder circuit 110 (e.g., a vector adder) that subtracts the input signal "x(n)" from the adapted predicted output vector "y(n)". It is computed as shown in equation 1.

$$\text{vector } e(n) = \text{vector } y(n) - x(n) \qquad \text{Equation 1}$$

On the basis of this measure, the adaptive filter 108 will change its coefficients in attempt to reduce the difference between the adapted predicted output vector "y(n)" and the discrete input signal "x(n)."

While the system encompasses many techniques for choosing the coefficients of the programmable filter 106, in FIG. 1 the programmed filter 106 copies the adaptive filter coefficients at substantially the sampling rate of the enhancement system 100. The sampling rate of the enhancement system 100 may vary with a desired resolution of the enhanced speech signal. While the transfer functions of the adaptive filter 108 and programmed filter 106 may change as the amplitude and/or frequency of the input signal "x(n)" or the delayed input signal "x(n–D)" changes, the programmed filter 106 has substantially the same transfer function as the adaptive filter 108 as each sample point of the input signal is processed. Temporally, this may occur at the sampling frequency of the enhancement system 100.

In FIG. 1, portions of the delayed input "x(n–D)" are processed by the programmed filter 106 to yield a predictive output vector "ŷ(n)". The predictive output vector "ŷ(n)" is then processed by weighting logic or a weighting circuit 112 to yield a scalar output. In FIG. 1, the weighting logic or circuit 112 may comprise a summing filter that removes the negative components of the predictive output vector "ŷ(n)" before summing the coefficients to derive a scalar output. The scalar output is then added to the input signal through adder logic or an adder circuit 114 (e.g., a scalar adder) which enhances the periodicity or harmonic structure of voiced speech with little or no strengthening of the background noise.

Figure 2:
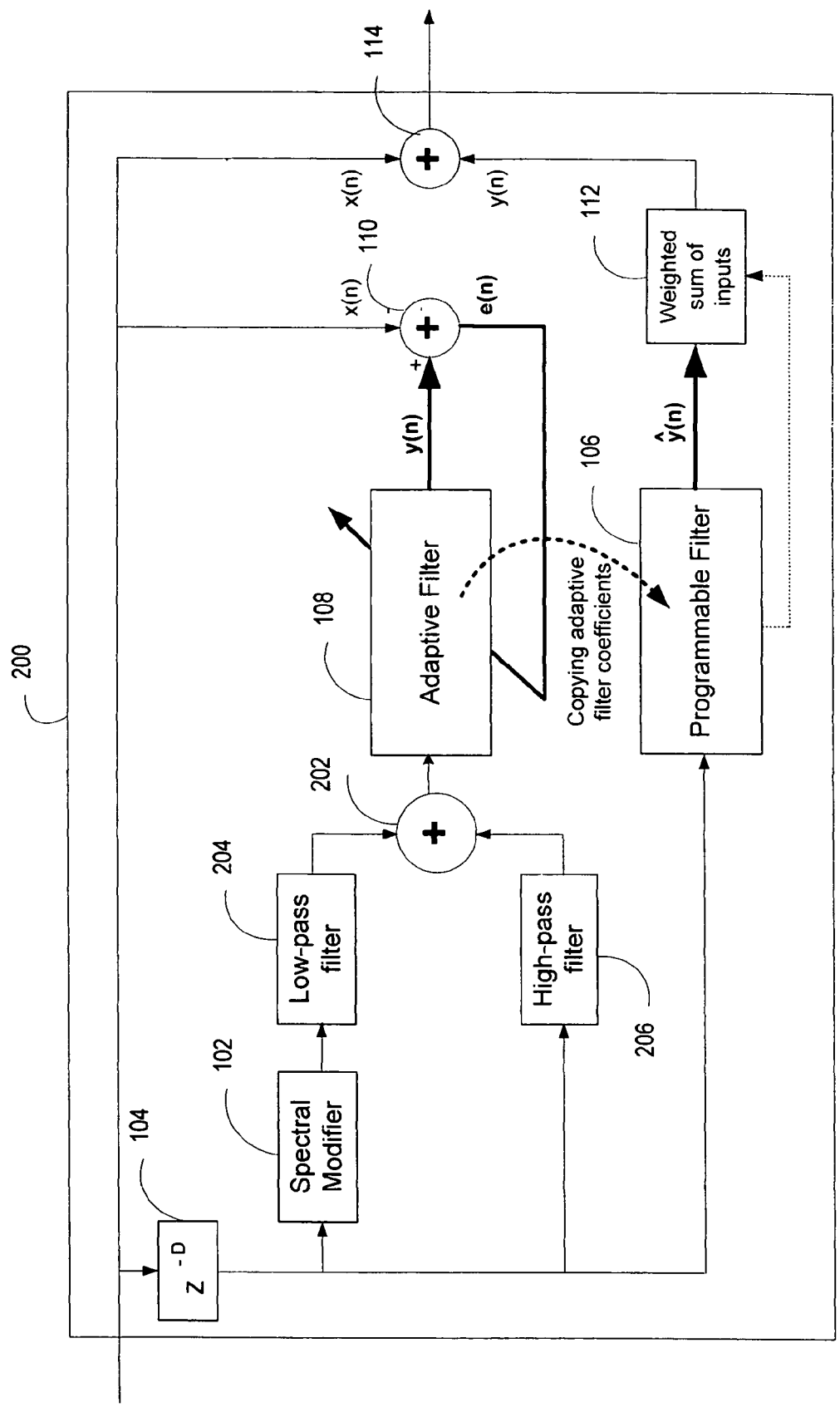
FIG. 2 is a block diagram of a second enhancement system.

To minimize enhancing high frequency components of the input or discrete input "x(n)", a front-end process, circuit(s), processor(s), controller(s) or interface may further condition the delayed input in other communication systems and/or enhancement systems. Like the system shown in FIGS. 1, 2, 3, and 8, the delay may correspond to a maximum pitch period or may vary with each application. In FIG. 2, the discrete logic or circuit(s) of the front-end may allow selected frequencies of the signal having spectrally flattened background noise to pass to an adder logic or adder circuit 202 (e.g., a signal adder). A low pass filter 204 may substantially attenuate or substantially dampen the high frequency components of the spectrally modified signal that was processed by the spectral modifier 102. The cutoff frequency of the lowpass filter 204 may substantially coincide with the cutoff frequency of a high pass filter 206. The cutoff frequency of these filters may comprise a frequency or range that encompasses the transitions between the pass band and the adjacent attenuation band. In FIG. 2, other discrete logic or circuits of the front-end substantially pass all frequencies of the delayed signal above the cutoff frequency which are then added to the passed frequencies of the spectrally modified signal through the adder logic or circuit 202. An adaptive filter 108, such as a moving average filter, nonrecursive discrete-time filter, or adaptive FIR filter may then model the combined spectrum.

In FIG. 2, an error signal (e.g., vector) is derived through adder logic or an adder circuit 110 (e.g., a vector adder) that subtracts the input signal from the adapted predicted output vector "y(n)". The difference between the discrete input and adapted predicted output vector "y(n)" comprises an error vector "e(n)". While this system encompasses many techniques for choosing the coefficients of the programmable filter, in FIG. 2 the programmed filter 106 copies the adaptive filter coefficients at substantially the sampling rate of the enhancement system 200. In this system, the programmed filter 106 comprises a single input and multiple outputs (e.g., vector coefficients). The sampling rate of this enhancement system 200 may vary with a desired resolution of the enhanced speech signal. While the transfer functions of the adaptive filter 108 and programmed filter 106 may change as the amplitude and/or frequency of the combined signal changes, the programmed filter 106 has substantially the same transfer function as the adaptive filter 108 as each sample point of the input signal is processed. Temporally, this may occur at the sampling frequency of this enhancement system 200.

In FIG. 2, the combined input is processed by the programmed filter 106 to yield a predictive output vector "ŷ(n)". The predictive output vector "ŷ(n)" is then processed by weighting logic or a weighting circuit 112 to yield a scalar output. In FIG. 2, the weighting logic or circuit 112 may comprise a summing filter that removes the negative components of the predictive output vector "ŷ(n)" before summing the vector components to derive a scalar output. The scalar output is then added to the input signal through adder logic or an adder circuit 114 (e.g., a scalar) which enhances the periodicity or harmonic structure of voiced speech to derive an enhanced speech signal.

In other communication systems and/or enhancement systems 300, a spectral mask 302 may improve the signal-to-noise ratio of a discrete input signal. In these enhancement systems 300, an alternative front-end conditions the frequency spectrum and filters the delayed input signal before the signal is passed to the adaptive filter 108. In some enhancement systems the filter comprises a predetermined or programmable spectral mask 302 that passes substantially aural frequencies. In these enhancement systems 300 the spectral mask 302 substantially blocks or substantially attenuates the flattened noise spectrum that lies outside of the aural pass-band. In other communication and enhancement systems, the pass-band of the spectral mask varies. In some enhancement systems, an entire segment or a portion of a voiced speech may be enhanced to match the bandwidth of a communication system, including wireless communication system(s) interfaced or integrated within a vehicle. In other systems, the pass-band of the spectral mask may be programmed or configured to pass any frequency range, amplitude, and may take on any spectral shape. Like the enhancement or communication systems 100 or 200 shown in FIGS. 1 and 2 the signal that includes the spectrally flattened and filtered noise spectrum may then be processed as described above.

Figure 3:
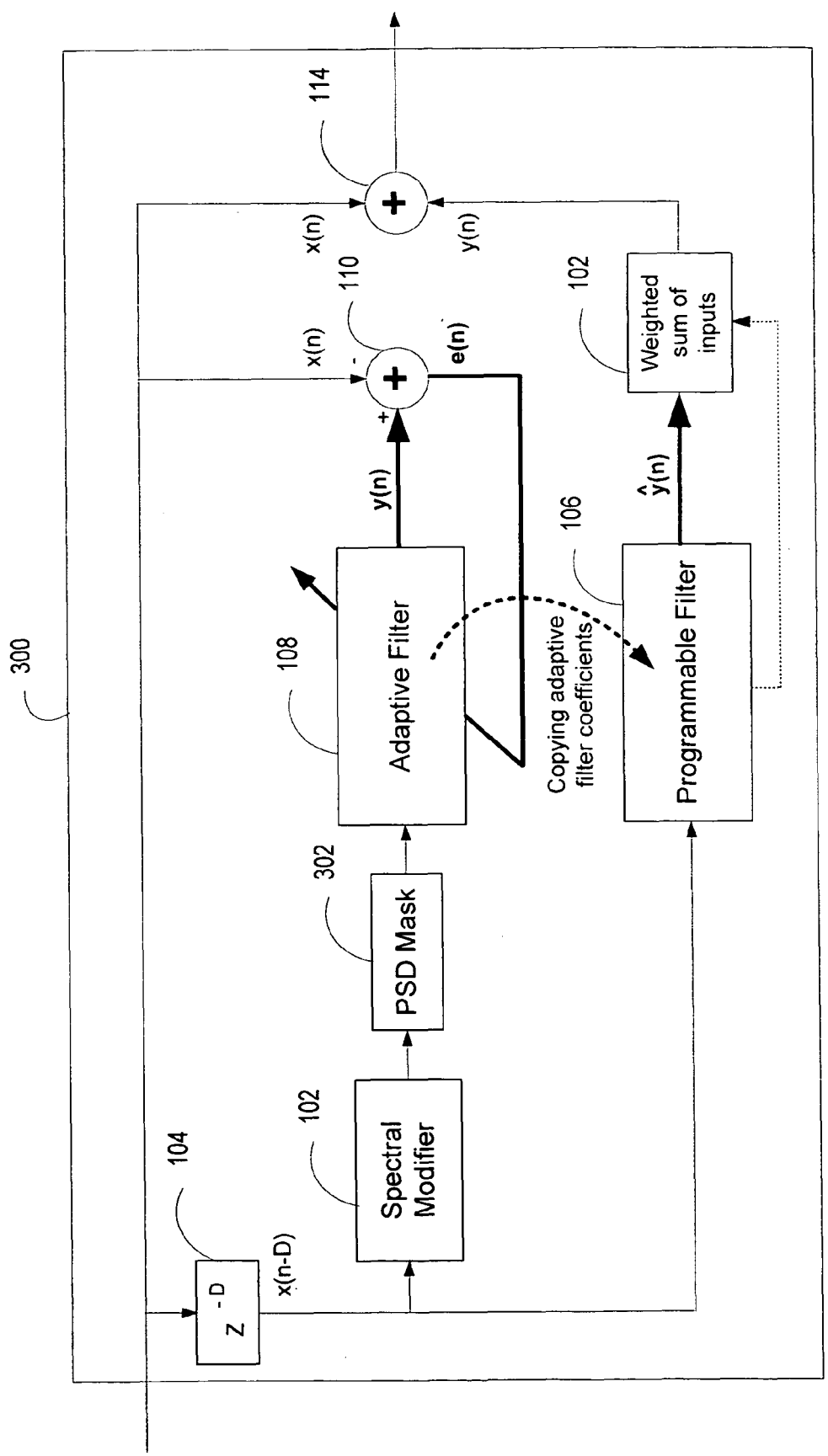
FIG. 3 is a block diagram of a third enhancement system.
Figure 4:
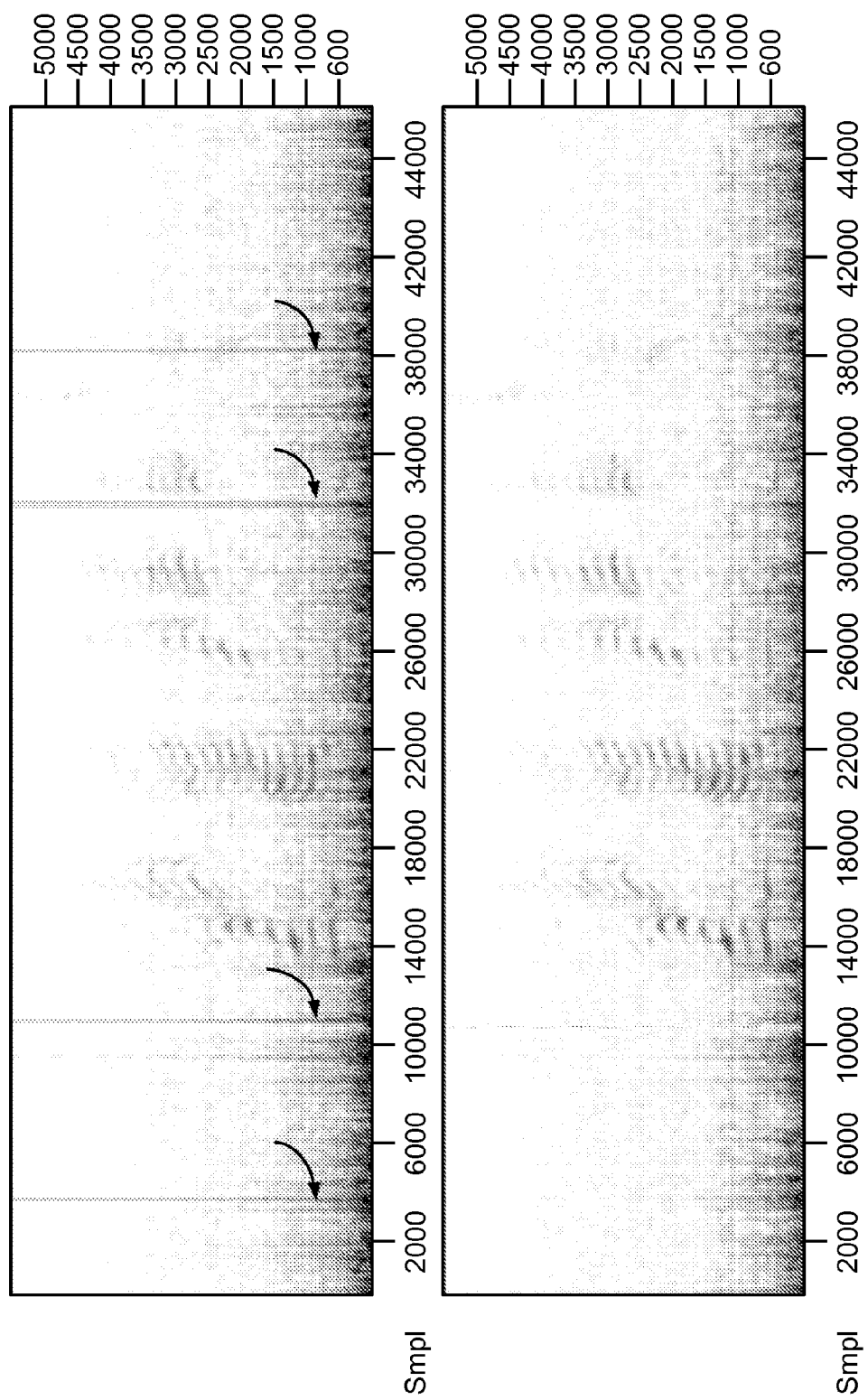
FIG. 4 are plots of an aural signal positioned above an enhanced aural signal.

To overcome the effects of low frequency interference, the pass-band of the low pass filter 204 of FIG. 2 or the spectral mask 302 of FIG. 3 may be programmed or configured to flatten and pass only low frequency potions of an aural signal. As shown by the arrows in FIG. 4, an input signal may include low frequency interference or artifacts. These artifacts may be heard under many conditions or created by other systems. Wind striking a vehicle "wind buffets," an alternator generating a current, a cooling system cooling a vehicle, and many other systems or conditions may create interference. Although the artifacts appear to have some periodicity, the communication and enhancement system enhanced portions of the periodic aural signal without enhancing the low frequency artifacts. In some systems the amplitude or signal strength of the artifacts may also be weakened or dampened by the enhancement system.

Figure 5:
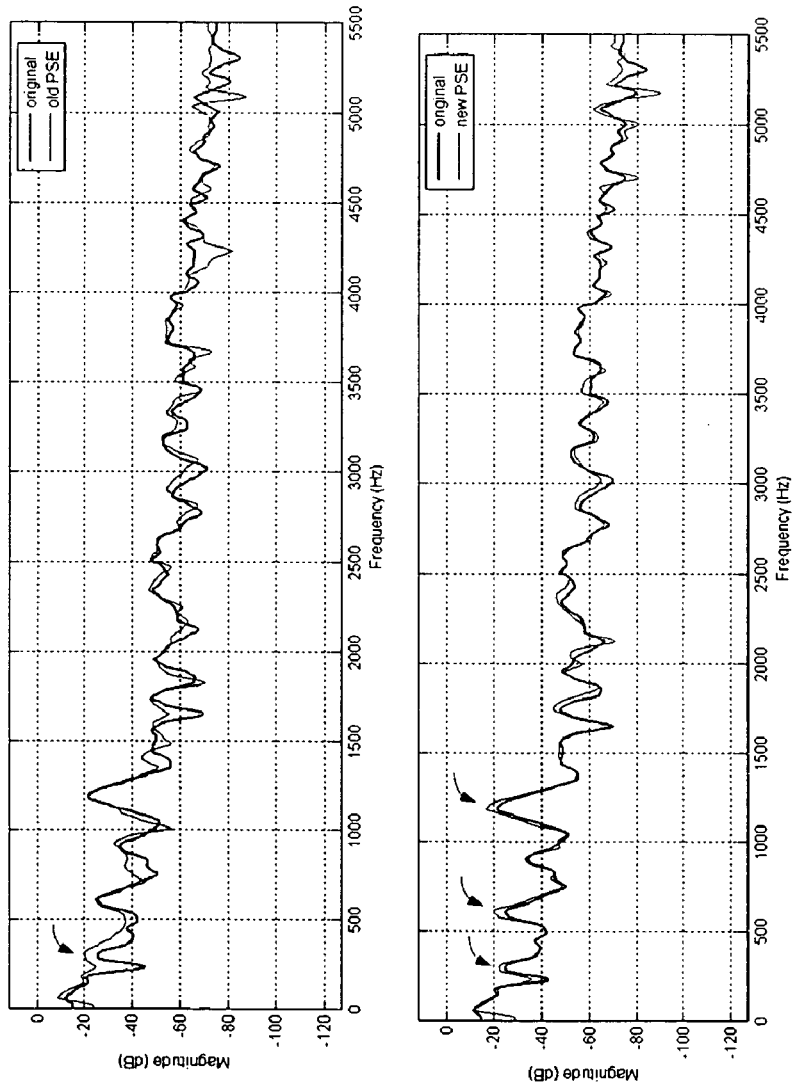
FIG. 5 are plots of an enhanced and over enhanced aural signal.

When low frequency interference is not distinguished from speech signals that exhibit periodicity, enhancement systems or circuits may over enhance the interference heard in an aural signal. As shown in the upper plot of FIG. 5, the arrow points to an unwanted enhancement of a low frequency interference created by wind buffets. In this figure, an enhancement amplifies the low frequency artifacts masking some speech in a snap shot of a speech signal taken at about 1.281 seconds. As shown in the lower plot, the communication or enhancement system of FIGS. 2 and 3 strengthen the peaks of the speech signal with little or no enhancement of the interference or low frequency interference.

Figure 6:
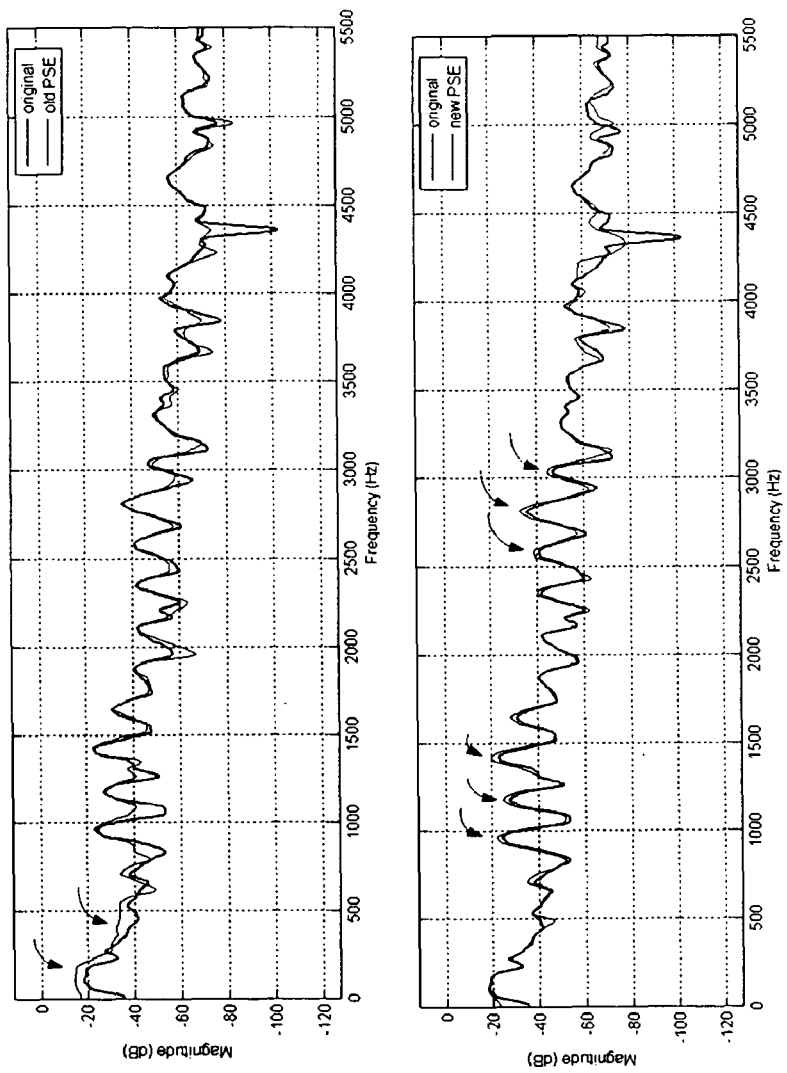
FIG. 6 are plots of an enhanced and over enhanced aural signal.
Figure 7:
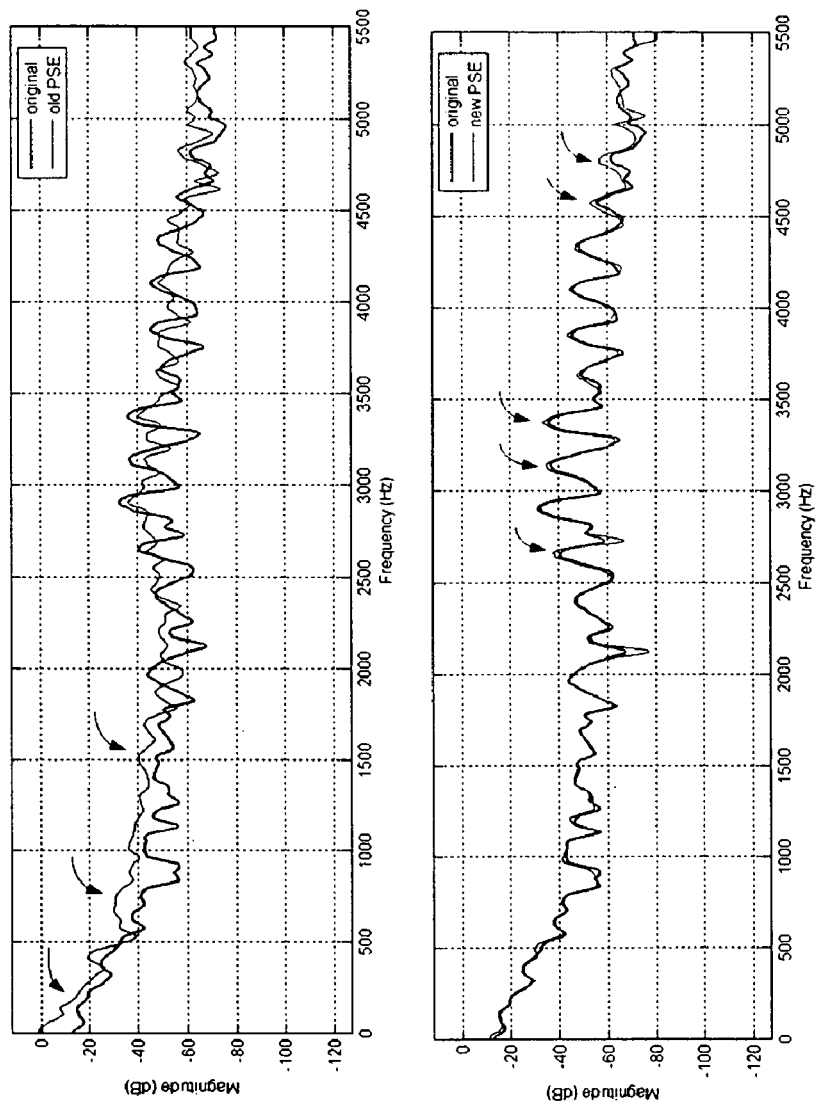
FIG. 7 are plots of an enhanced and over enhanced aural signal.

FIGS. 6 and 7 show other plots that illustrate the effect of not distinguishing interference from speech when enhancing speech signals. As shown in the upper plots of FIGS. 6 and 7, the arrows point to unwanted enhancements of low frequency interference created by wind buffets. In these figures, an enhancement amplifies the low frequency artifacts masking speech in snap shots taken at about 2.976 seconds of speech (FIG. 6) and 2.653 seconds of speech (FIG. 7). As shown in the lower plots, the communication and enhancement systems of FIGS. 2 and 3 strengthen or amplify the peaks of the speech signal with little or no enhancement of the interference or low frequency artifacts.

Figure 8:
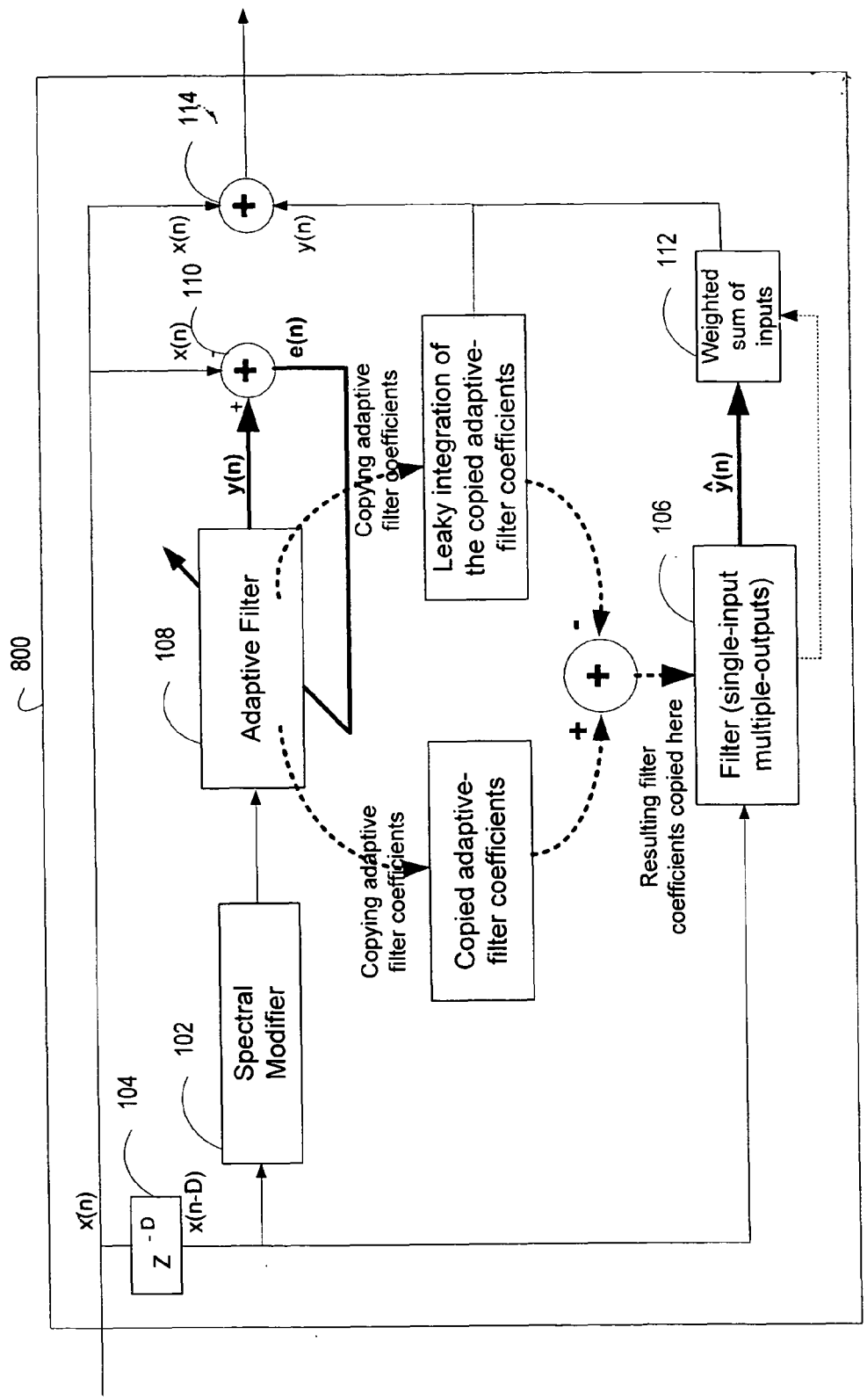
FIG. 8 is a block diagram of a third enhancement system.

FIG. 8 is an alternative communication or enhancement system 800 that discriminates against tonal noise or continuous interference at one or more substantially common frequencies. These alternative enhancement systems 800 may include the hardware and/or software that implements the spectral modifier 102 described above. The spectral modification of FIG. 8 may include the spectral flattening 102 of background noise of FIG. 1; the spectral flattening 102, low pass filter 204, high pass filter 206, and adder 202 of FIG. 2; the spectral flattening 102 and spectral mask 302 of FIG. 3; or combinations of one or more elements of these front-ends. In some enhancement systems, spectral modification 102 may comprise other logic such as a spectral flattener coupled to a bandpass filter or a linear predictive coding filter.

In FIG. 8, the spectral modifier 102 changes the frequency spectrum of a delayed signal. The digital delay 104, which may be implemented by a portion of a memory or buffer that temporarily holds data to be transferred to another location for a programmed or predetermined period, couples an input "x(n)" to the spectral modifier 102 and a programmed filter 106 having a single input and multiple outputs (e.g., vector coefficients). The spectral modifier 102 substantially flattens the spectral character of background noise detected in a portion of the input "x(n)" or the delayed input "x(n−D)". In some enhancement systems the frequency and/or amplitude of the background noise is detected during talk spurts and pauses. In these and other enhancement systems, the background noise is substantially flattened or dampened. The noise may be flattened or dampened to a comfort noise level, noise floor, or a predetermined level that a user expects to hear.

An adaptive filter 108, such as a moving average filter, nonrecursive discrete-time filter, or adaptive FIR filter models a portion of the speech spectrum with the flattened or dampened noise spectrum. In some enhancement systems 800 the adaptive filter 108 changes or adapts its coefficients to match as closely as possible or approximate the response of the input signal "x(n)". Using an adaptive filtering algorithm the error signal "e(n)" is derived through adder logic or an adder circuit 110 (e.g., a vector adder) that subtracts the input signal "x(n)" from the adapted predicted output vector "y(n)." It is computed as shown in equation 1.

On the basis of this measure, the adaptive filter will change its coefficients in its attempts to reduce the difference between the adapted predicted output vector "y(n)" and the discrete input signal "x(n)."

While this enhancement 800 system encompasses many techniques for choosing the coefficients of the programmable filter 106 to meet a desired enhancement, in FIG. 8 the programmed filter coefficients are derived by subtracting a moving average of the filter coefficients from an instantaneous estimate of the adaptive filter coefficients. While any time average may be used, in FIG. 8, a leaky average is used to derive the programmable filter coefficients. The leaky average may be expressed by equations 2 or 3

$$y(n)=(1-\alpha)y(n-1)+\alpha h(n) \qquad \text{Equation 2}$$

$$y(n)=y(n-1)+\alpha(h(n)-y(n-1)) \qquad \text{Equation 3}$$

where y(n) is the leaky average vector of the filter coefficients, h(n) is the input filter coefficient vector, and α is the leakage factor. By taking a leaky average of the adaptive-filter coefficients, tonal noise present in the input signal may be substantially captured. The leaky average of the filter coefficients may then be subtracted from the substantially instantaneous estimate of the adaptive-filter coefficients to remove the effect of tonal noise from the estimated adaptive filter coefficients. The resulting or modified coefficients are copied to the programmed filter 106 at substantially the sampling rate of the enhancement system 800. While the transfer functions of the adaptive filter 108 and programmed filter 106 are not the same in FIG. 8 and may change as the input signal "x(n)" or the delayed input signal "x(n−D)" changes, the transfer function of the programmed filter 106 will track the transfer function of the adaptive filter 108 as each sample point of the input signal is processed. In FIG. 8, coefficients of the transfer functions are related by a temporal moving average.

In FIG. 8, portions of the delayed input "x(n−D)" are processed by the programmed filter 106 to yield a predictive output vector "ŷ(n)". The predictive output vector "ŷ(n)" is then processed by weighting logic or a weighting circuit 112 to yield a scalar output. In FIG. 8, the weighting logic or circuit 112 may comprise a summing filter that removes the negative coefficients of the predictive output vector "ŷ(n)" before summing the coefficients to derive a scalar output. The scalar output is then added to the input signal through adder logic or an adder circuit 114 (e.g., a scalar adder) which enhances the periodicity or harmonic structure of voiced speech without enhancing tonal noise.

Figure 9:
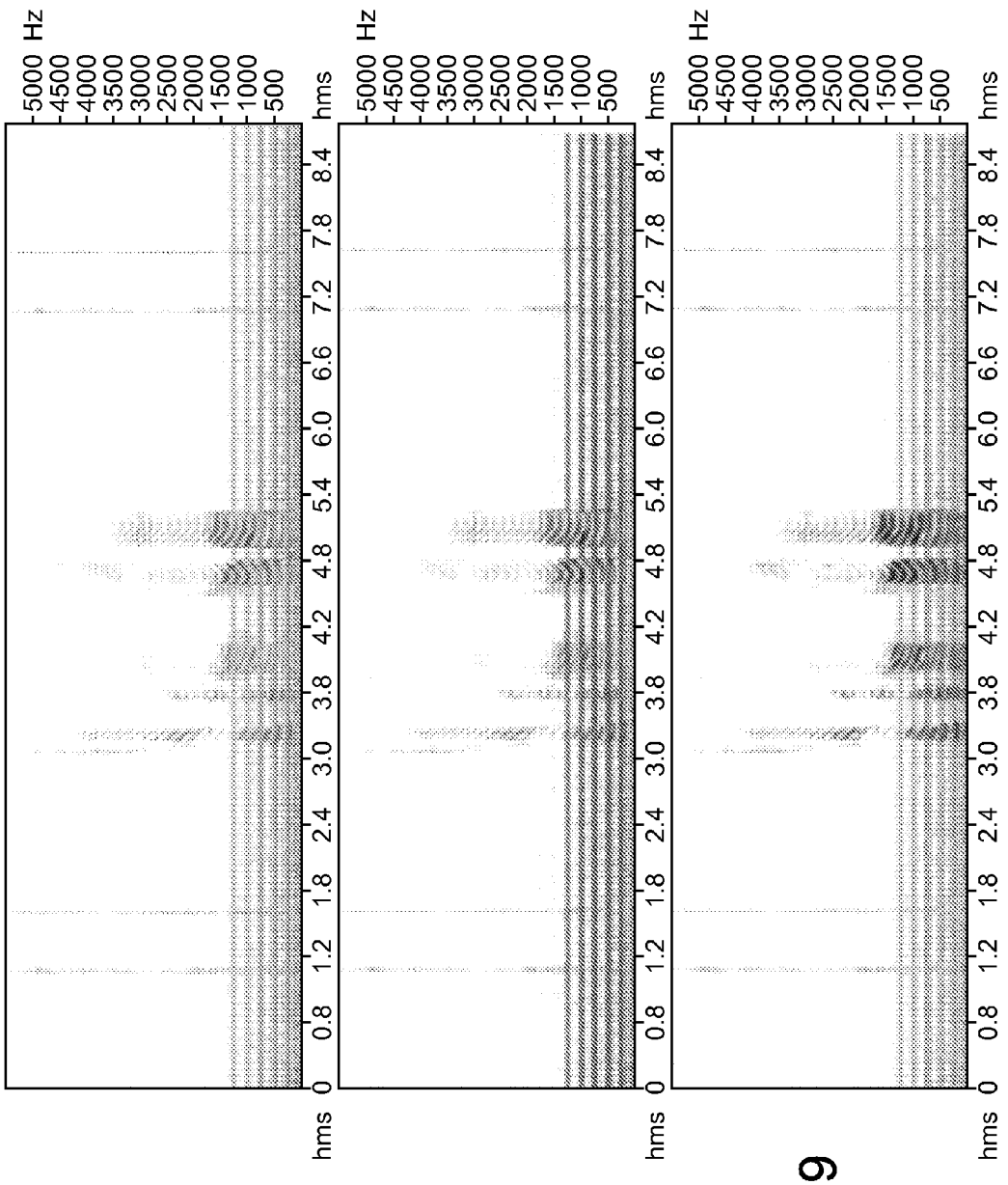
FIG. 9 are plots of an aural signal positioned above an over enhanced aural signal positioned above an enhanced aural signal.

When tonal interference is not distinguished from speech signals that exhibit periodicity, enhancement systems or circuits may over enhance the interference heard in an aural signal. As shown in the upper plot of FIG. 9, a tonal noise masks portions of an aural signal. In the middle plot of FIG. 9, the darker shading in the substantially horizontal lines shows that an enhancement is amplifying the continuous tonal noise. As shown in the lighter shading of the substantially horizontal lines in the lower plot and darker shading of portions of the voiced signal, the communication and/or enhancement system of FIG. 8 strengthens the amplitude of the speech signal with little or no amplification of the continuous interference of the tonal noise.

Figure 10:
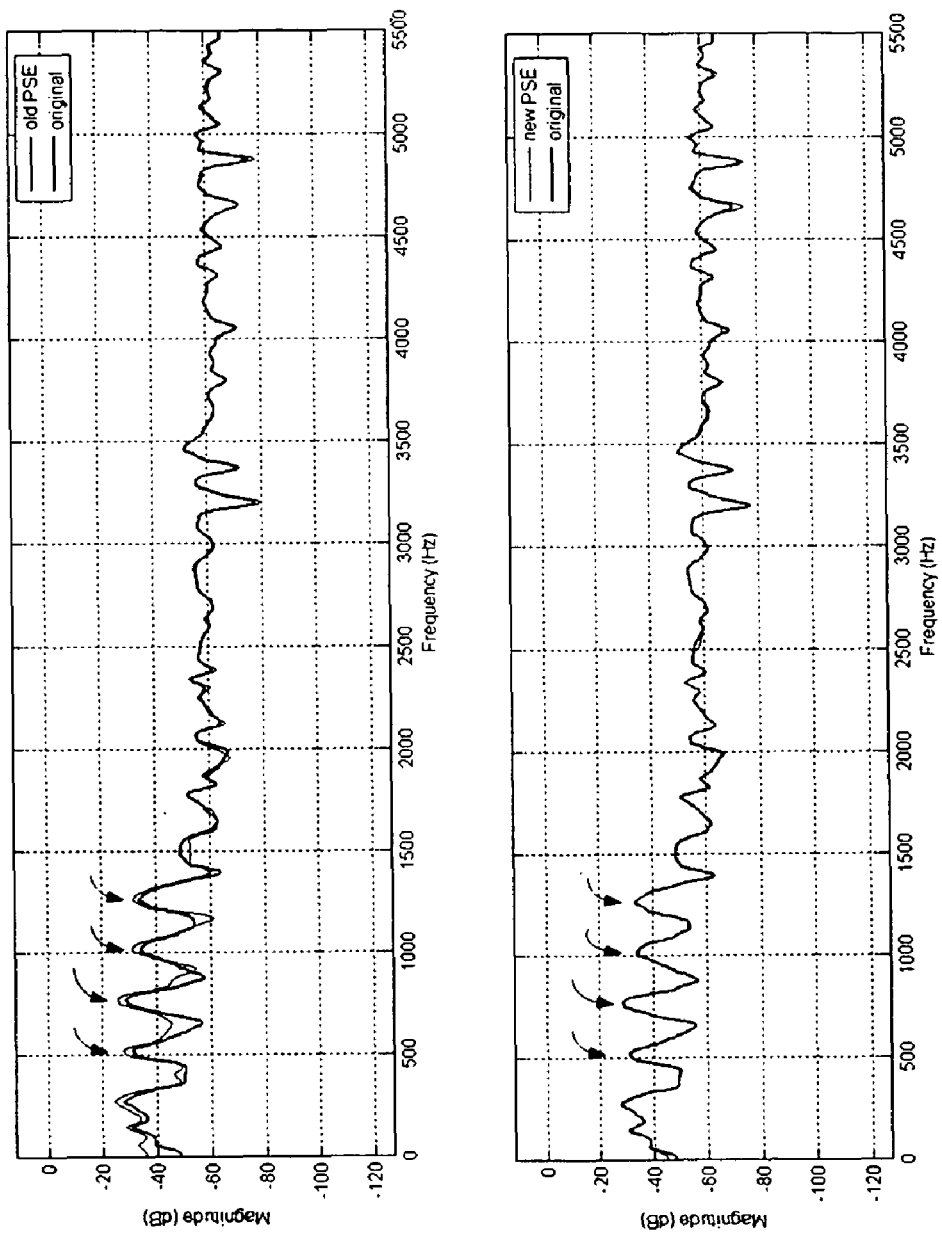
FIG. 10 are plots of an enhanced and over enhanced aural signal.
Figure 11:
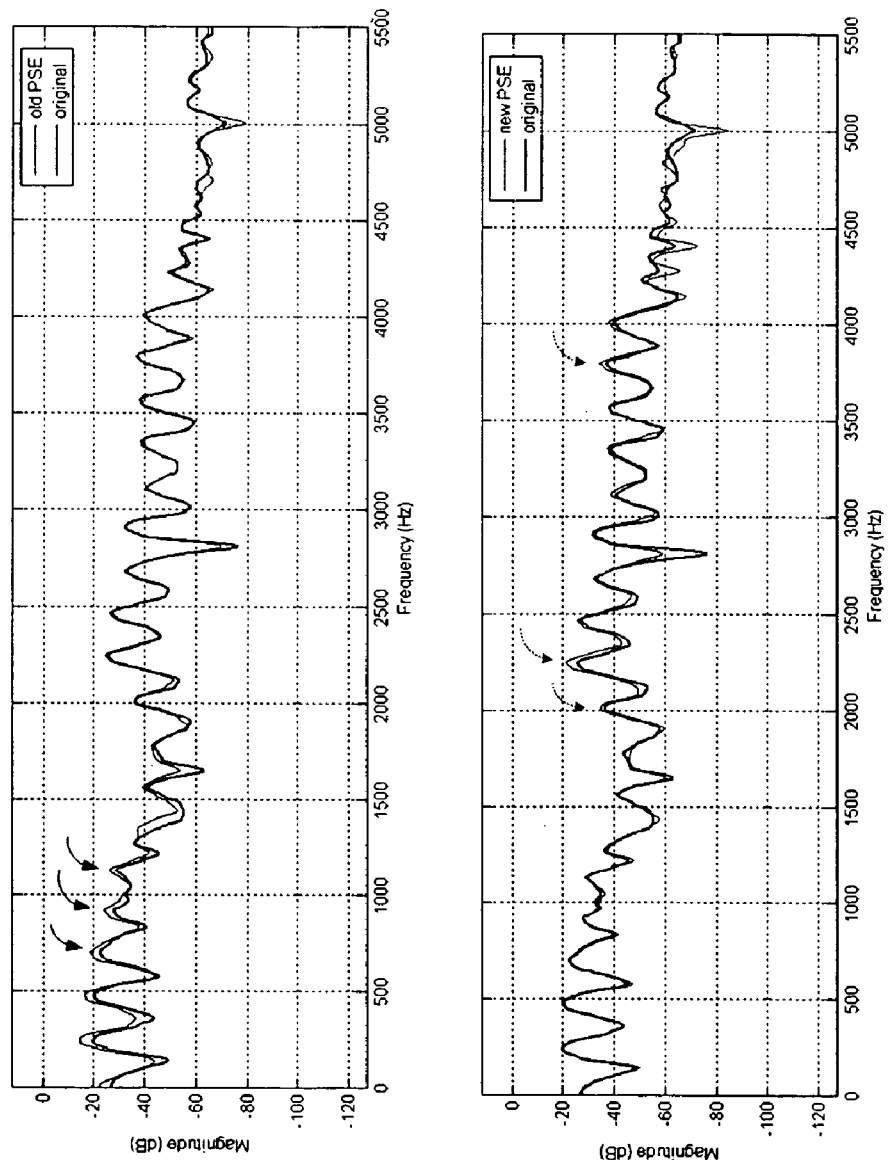
FIG. 11 are plots of an enhanced and over enhanced aural signal.
Figure 12:
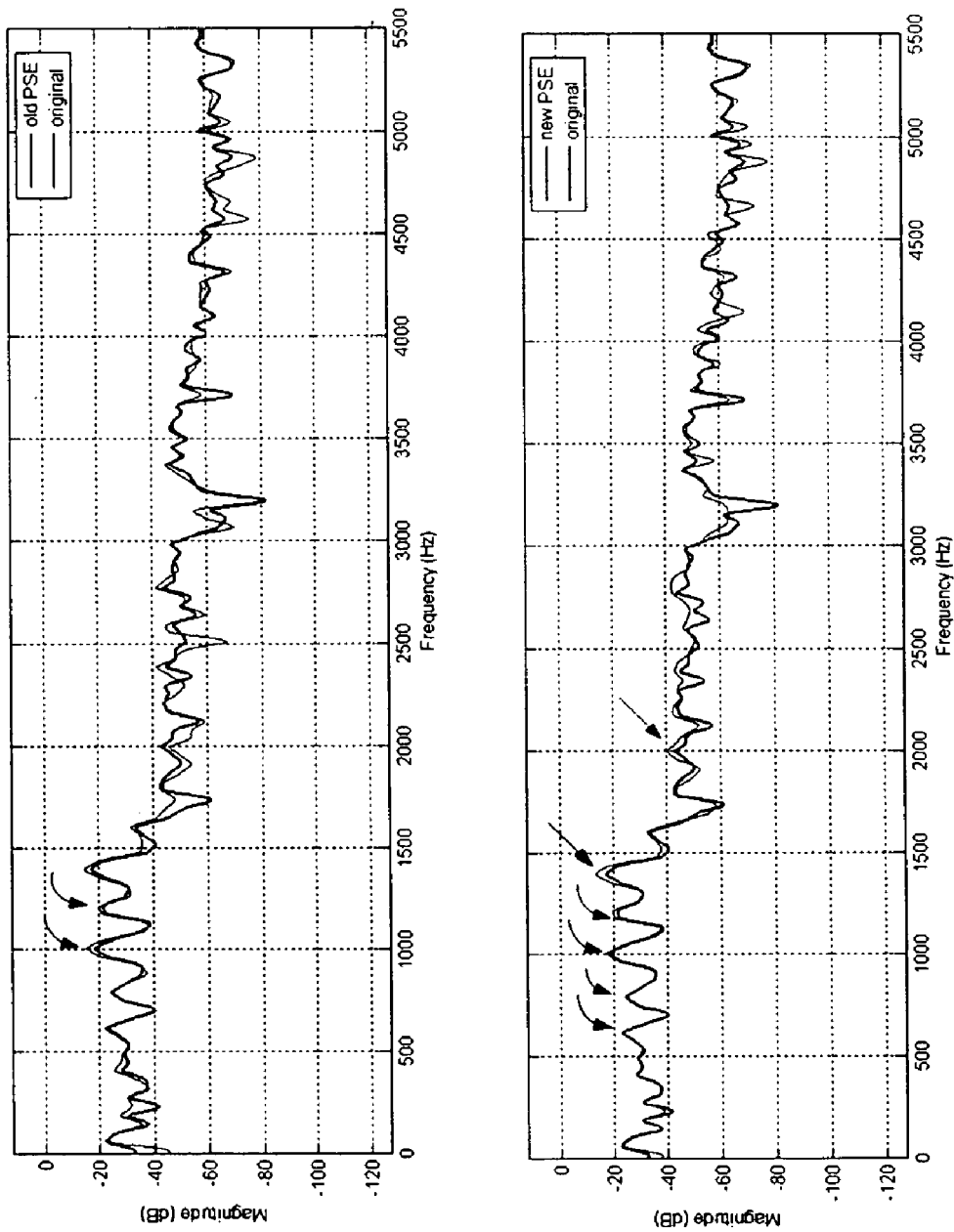
FIG. 12 are plots of an enhanced and over enhanced aural signal.

FIGS. 10, 11, and 12 show other plots that illustrate the effect of not distinguishing tonal noise from a speech or an aural signal. As shown in the upper plots of FIGS. 10-12, the arrows point to unwanted enhancements of continuous interference created by tonal noise. In these figures, an enhancement amplifies the tonal noise masking speech in snap shots taken at about 2.8 seconds of speech (FIG. 10), 3.2 seconds of speech (FIG. 11), and about 4.642 seconds of speech (FIG. 12). As shown in the lower plots, the communication and/or enhancement systems 800 of FIG. 8 increases the amplitudes of the peaks of the speech signal with little or no enhancement of the interference or tonal noise. In the frequency domain, the system enhances harmonics with enhancing the spectrum of the tonal noise.

Figure 13:
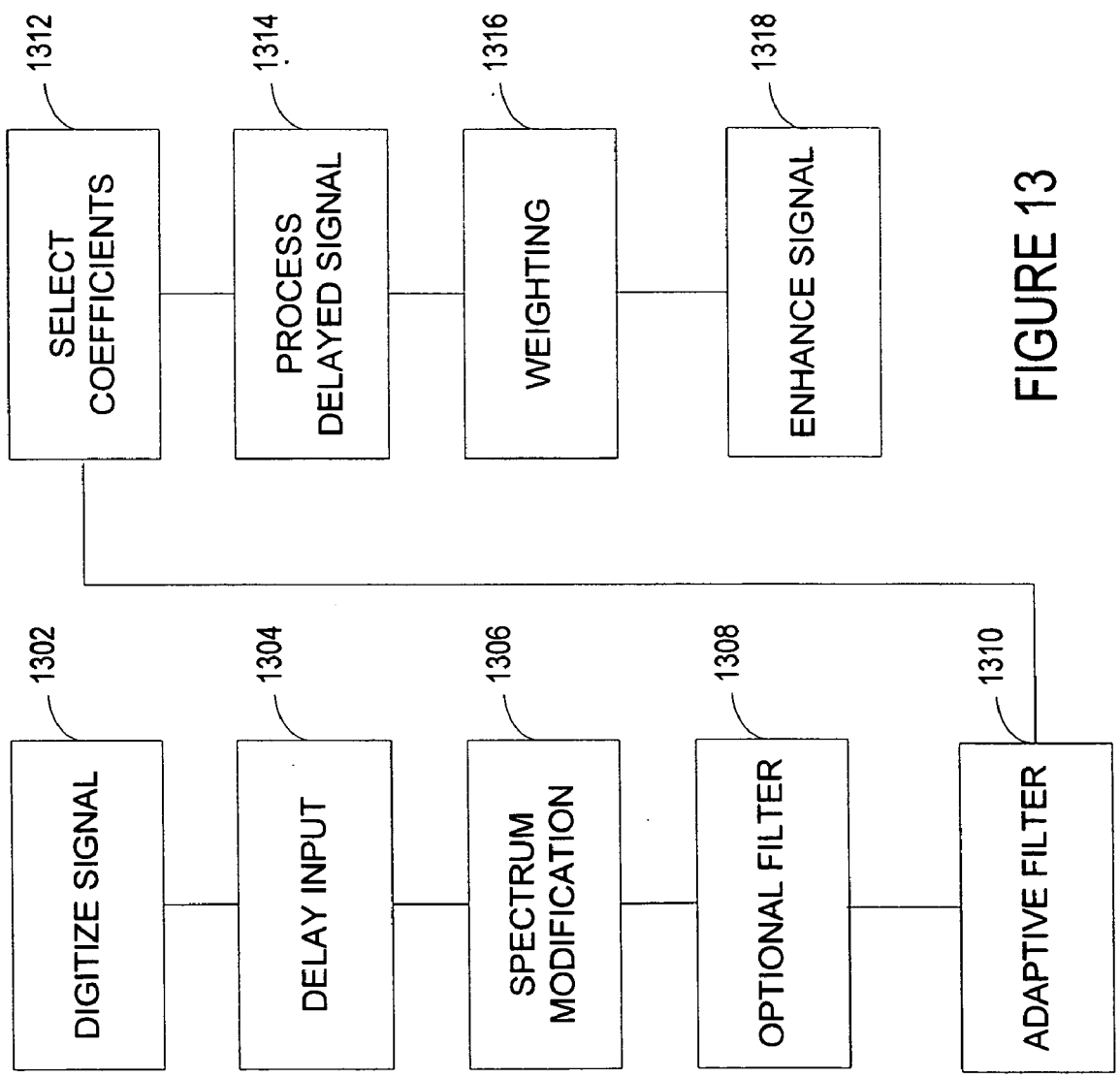
FIG. 13 is a flow diagram of a signal enhancement.

FIG. 13 is a flow diagram of a signal enhancement. In this process, a spectral modifier changes the frequency of a delayed discrete signal by flattening all or a portion of the background noise within a speech segment of an input signal. An input signal is digitized (Act 1302) and delayed (Act 1304) before passing to a spectral modifier. In FIG. 13, the delay may be implemented by a memory, buffer, logic that counts to a specified number before passing the signal or other devices that causes the input signal to reach its destination later in time. In some systems the delay may comprise a propagation delay.

The spectrum of the input signal is modified at Act 1306. A spectral modifier substantially flattens the spectral character of all or a portion of the background noise before it is filtered by one or more (e.g., multistage) filters (e.g., a low pass filter, high pass filter, band pass filter, and/or spectral mask) at optional Act 1308. In some methods, the frequency and amplitude of the background noise is detected during talk spurts and pauses and may be modeled by a linear predictive coding filter. In these and other methods, some or all of the background noise is substantially flattened, and in other systems some or all of the background noise is dampened. The noise may be dampened to a comfort noise level, noise floor, or a predetermined level that a user expects to hear.

An adaptive filter such as a moving average filter, nonrecursive discrete-time filter, or adaptive FIR filter models a portion of the speech spectrum with the flattened or dampened noise spectrum at Act 1310. In some enhancement systems the adaptive filter changes or adapts its coefficients to match as closely as possible or approximate the input signal "x(n)" at discrete points in time. Using an adaptive filtering algorithm the error signal "e(n)" is derived through adder logic or an adder circuit (e.g., a vector adder) that subtracts the input signal "x(n)" from the adapted predicted output vector "y(n)". It is computed as shown in equation 1.

On the basis of this measure, the adaptive filter will change its coefficients in its attempts to reduce the difference between the adapted predicted output vector "y(n)" and the discrete input signal "x(n)."

While this method encompasses many techniques for choosing the coefficients of a programmable filter, at Act 1312 the programmed filter copies the adaptive filter coefficients at substantially the sampling rate of the enhancement system. The sampling rate of the enhancement system may vary with a desired resolution of the enhanced speech signal. While the transfer functions of the adaptive filter and programmed filter may change as the amplitude and/or frequency of the input signal "e(n) or delayed input signal "x(n−D)" changes, the programmed filter may have substantially the same transfer function as the adaptive filter as each sample point of the input signal is processed. Temporally, this may occur at the sampling frequency of the enhancement system 100.

At Act 1314, portions of the delayed input "x(n−D)" are processed by the programmed filter to yield a predictive output vector "ŷ(n)". The predictive output vector "ŷ(n)" is then processed by weighting logic or a weighting circuit to yield a scalar output at Act 1316. In FIG. 13, the weighting logic or circuit may comprise a summing filter that removes the negative coefficients of the predictive output vector "ŷ(n)" before summing the coefficients to derive a scalar output. The scalar output is then added to the input signal through adder logic or an adder circuit (e.g., a scalar adder) at Act 1318 which enhances the periodicity or harmonic structure of voiced speech to derive an enhanced speech signal.

Figure 14:
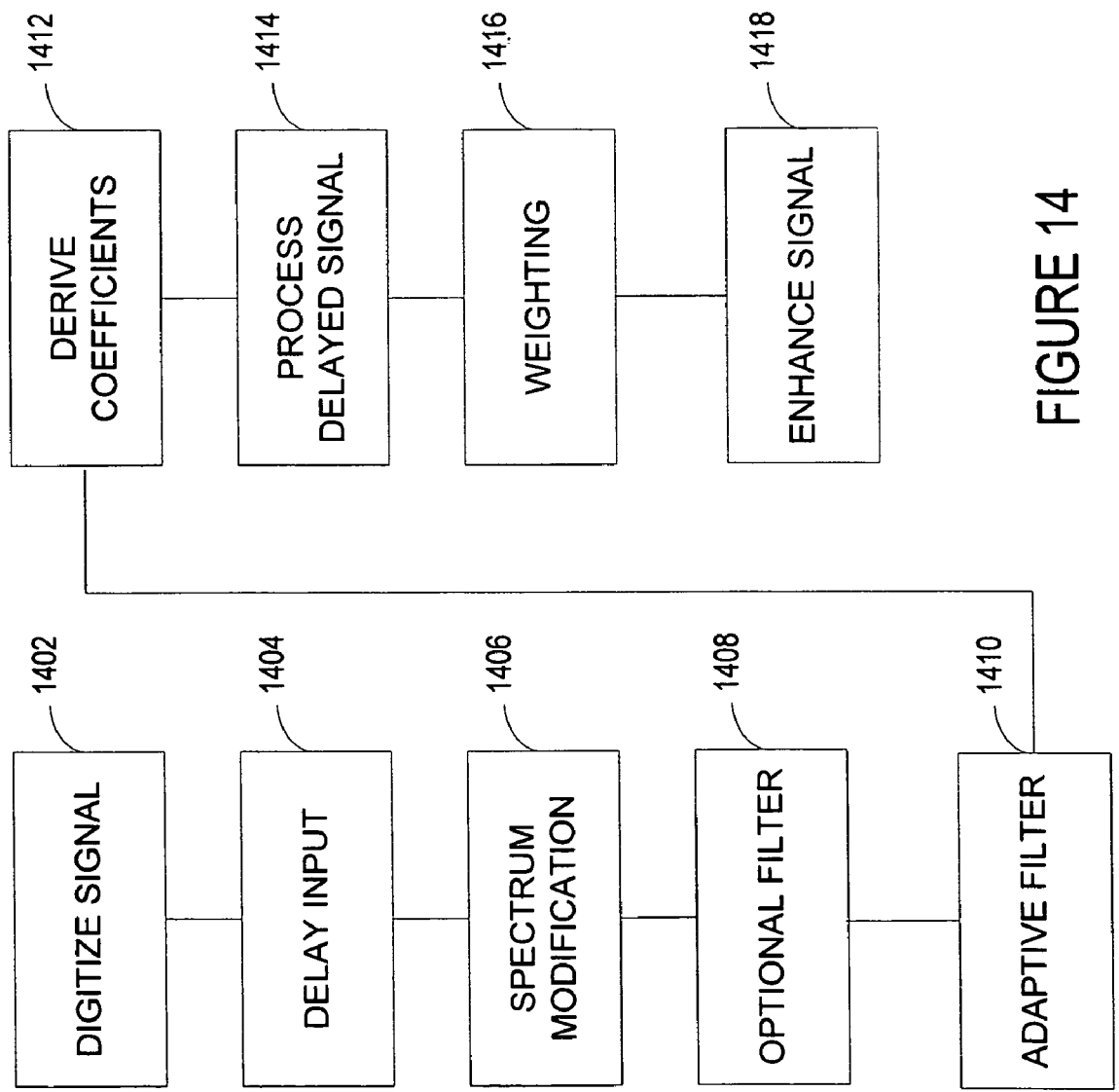
FIG. 14 is an alternative flow diagram of a signal enhancement.

FIG. 14 is an alternative flow diagram of a signal enhancement that discriminates between tonal noise or continuous interference and speech. In FIG. 14 the, spectral modifier changes the frequency of a delayed discrete signal by flattening all or a portion of the background noise within a speech segment or an input signal. An input signal is digitized (Act 1402) and delayed (Act 1404) before passing to a spectral modifier. The spectral modifier changes the frequency spectrum of the delayed signal (Act 1406). The delay may be implemented by a memory, buffer, or logic that counts to a specified number before passing the signal or other devices that causes the input signal to reach its destination later in time. In some systems the delay may comprise a propagation delay.

The spectrum of the input signal is modified at Act 1404 before it is filtered by one or more (e.g., multistage) filters (e.g., a low pass filter, high pass filter, band pass filter, and/or spectral mask) at optional Act 1408. The spectral modifier substantially flattens the spectral character of some or all of the background noise detected in a portion of the input "x(n)" or the delayed input "x(n−D)". In some methods the frequency and/or amplitude of the background noise is detected during talk spurts and pauses. In these and other methods, the background noise is substantially flattened or dampened. The noise may be flattened or dampened to a comfort noise level, noise floor, or a predetermined level that a user expects to hear.

An adaptive filter such as a moving average filter, nonrecursive discrete-time filter, or adaptive FIR filter models a portion of the speech spectrum with the flattened or dampened noise spectrum at Act 1410. In some enhancement methods the adaptive filter changes or adapts its coefficients to match as closely as possible the response of the input signal "x(n)". Using an adaptive filtering algorithm the error signal "e(n)" is derived through adder logic or an adder circuit at (e.g., a vector adder) that subtracts the input signal "x(n)" from the adapted predicted output vector "y(n)." It is computed as shown in equation 1.

On the basis of this measure, the adaptive filter will change its coefficients in its attempts to reduce the difference between the adapted predicted output vector "y(n)" and the discrete input signal "x(n)."

While this method encompasses many techniques for choosing the coefficients of the programmable filter to meet a desired enhancement, Act 1412 the programmed filter coefficients are derived by subtracting a moving average of the filter coefficients from an instantaneous estimate of the adaptive filter coefficients. While any time average may be used, in FIG. 8, a leaky average is used to derive the programmable filter coefficients. The leaky average may be expressed by equations 2 or 3 where y(n) is the leaky average vector of the filter coefficients, h(n) is the input filter coefficient vector, and a is the leakage factor. By taking a leaky average of the adaptive-filter coefficients, tonal noise present in the input signal may be substantially captured. The leaky average of the filter coefficients may then be subtracted from the substantially instantaneous estimate of the adaptive-filter coefficients to remove the effect of tonal noise from the estimated adaptive filter coefficients. The resulting or modified coefficients may be copied to the programmed filter at substantially the sampling rate of the enhancement system. While the transfer functions of the adaptive filter and programmed filter are not the same and may change as the input signal "x(n) or the delayed input signal "x(n−D)" changes, the transfer function of the programmed filter may track the transfer function of the adaptive filter as each sample point of the input signal is processed. In some methods, the coefficients of the transfer functions are related by a temporal moving average.

At Act 1414, portions of the delayed input "x(n−D)" are processed by the programmed filter to yield a predictive output vector "ŷ(n)". The predictive output vector "ŷ(n)" is then processed by weighting logic or a weighting circuit to yield a scalar output at Act 1416. The weighting logic or circuit may comprise a summing filter that removes the negative coefficients of the predictive output vector "ŷ(n)" before summing the coefficients to derive a scalar output. The scalar output is then added to the input signal through adder logic or an adder circuit at Act 1418 (e.g., a scalar adder) which enhances the periodicity or harmonic structure of voiced speech without enhancing tonal noise.

Each of the systems and methods described above may be encoded in a signal bearing medium, a computer readable medium such as a memory, programmed within a device such as one or more integrated circuits, or processed by a controller or a digital signal processor. If the methods are performed by software, the software may reside in a memory resident to or interfaced to the spectral modifier 102, adaptive filter 108, programmed filter 106 or any other type of non-volatile or volatile memory interfaced, or resident to the elements or logic that comprise the enhancement system. The memory may include an ordered listing of executable instructions for implementing logical functions. A logical function may be implemented through digital circuitry, through source code, through analog circuitry, or through an analog source such through an analog electrical, or optical signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine-readable medium," "propagated-signal" medium, and/or "signal-bearing medium" may comprise any apparatus that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM" (electronic), a Read-Only Memory "ROM" (electronic), an Erasable Programmable Read-Only Memory (EPROM or Flash memory) (electronic), or an optical fiber (optical). A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

The enhancement system may be modified or adapted to any technology or devices. The above described enhancement systems may couple or interface remote or local automatic speech recognition "ASR" engines. The ASR engines may be embodied in instruments that convert voice and other sounds into a form that may be transmitted to remote locations, such as landline and wireless communication devices (including wireless protocols such as those described in this disclosure) that may include telephones and audio equipment and that may be in a device or structure that transports persons or things (e.g., a vehicle) or stand alone within the devices. Similarly, the enhancement may be embodied in a vehicle with ASR or without ASR.

The ASR engines may be embodied in telephone logic that in some devices are a unitary part of vehicle control system or interface a vehicle control system. The enhancement system may couple pre-processing and post processing logic, such as that described in U.S. application Ser. No. 10/973,575 "Periodic Signal Enhancement System," filed Oct. 26, 2004, which is incorporated herein by reference. Similarly, all or some of the delay logic, adaptive filter, vector adder, and scalar adder may be modified or replaced by the enhancement system or logic described U.S. application Ser. No. 10/973,575.

The speech enhancement system is also adaptable and may interface systems that detect and/or monitor sound wirelessly or through electrical or optical devices or methods. When certain sounds or interference are detected, the system may enable the enhancement system to prevent the amplification or gain adjustment of these sounds or interference. Through a bus, such as communication bus a noise detector may send a notice such as an interrupt (hardware of software interrupt) or a message to prevent the enhancement of these sounds or interferences while enhancing some or the entire speech signal. In these applications, the enhancement logic may interface or be incorporated within one or more circuits, logic, systems or methods described in "Method for Suppressing Wind Noise," U.S. application Ser. No. 10/410,736 and Ser. No. 10/688,802; and "System for Suppressing Rain Noise," U.S. application Ser. No. 11/006,935, each of which is incorporated herein by reference.

The enhancement logic improves the perceptual quality of a processed speech signal. The logic may automatically identify and enhance speech segments without amplifying some or all sensed noise. Selected voiced and/or unvoiced segments may be processed and amplified in one or more frequency bands. To improve perceptual quality, adaptive gain adjustments may be made in the discrete domain. The system may adjust the gain of only some of or the entire speech segments with some adjustments based on a sensed or estimated noise or background noise signal. The versatility of the system allows the enhancement logic to enhance speech before it is passed or processed by a second system. In some applications, speech or other audio signals may be passed to remote, local, or mobile system such as an ASR engine that may capture and extract voice in the time, and/or frequency and/or discrete domains.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. An enhancement speech system that improves the perceptual quality of a processed speech segment, comprising:
   a discrete input;
   a delay unit that digitally delays a signal received through the discrete input;
   a spectral modifier coupled to the delay unit programmed to substantially flatten the spectral character of a background noise;
   an adaptive filter coupled to the spectral modifier that adapts filter characteristics to match a response to the signal received through the discrete input before the signal is delayed;
   a programmable filter coupled to the delay unit having a transfer function functionally related to a transfer function of the adaptive filter; and
   an adder comprising circuitry, a non-transitory computer-readable storage medium with program instructions stored thereon, or both, where the adder sums an output signal of the programmable filter and the signal received through the discrete input to increase a first periodic signal component in the signal received through the discrete input that is at least partially in-phase with a second periodic signal component in the output signal of the programmable filter.

2. The system of claim 1, where the delay unit comprises a programmable delay that delays passing the input signal to the adaptive filter.

3. The system of claim 1, where the delay unit comprises a programmable delay that delays passing the input signal to the programmable filter.

4. The system of claim 1, where the delay unit comprises a programmable delay that delays passing the input signal to the adaptive filter and the programmable filter.

5. The system of claim 1 where the spectral modifier is coupled to a circuit that allows frequencies below a predetermined frequency or frequency range to pass.

6. The speech system of claim 1 where the spectral modifier is coupled to an adder that adds a high frequency band of a delayed signal to a low frequency band comprising a signal having a spectrally flattened background noise.

7. The speech system of claim 1 where the spectral modifier is coupled to a spectral mask.

8. The speech system of claim 7 where the spectral mask is configured to substantially dampen signals lying outside an aural pass-band.

9. The speech system of claim 1 where the transfer function of the programmed filter is substantially the same as the transfer function of the adaptive filter at discrete points in time.

10. The speech system of claim 1 where the transfer function of the programmed filter and the transfer function of the adaptive filter change with the response of the input signal.

11. The speech system of claim 1 where coefficients of the programmable filter are functionally related to the coefficients of the adaptive filter, respectively.

12. The speech system of claim 11, where the functional relationship between the coefficients of the programmable filter and coefficients of the adaptive filter comprises a moving average, and where the coefficients of the programmable filter comprise a difference between a moving average of the coefficients of the adaptive filter and an instantaneous estimate of the coefficients of the adaptive filter.

13. The speech system of claim 12 where the functional relationship between the coefficients of the programmable filter and coefficients of the adaptive filter comprises a leaky average, and where the coefficients of the programmable filter comprise a difference between a leaky average of the coefficients of the adaptive filter and an instantaneous estimate of the coefficients of the adaptive filter.

14. The system of claim 1, where an input of the programmable filter is coupled to an output of the delay unit, where an input of the spectral modifier is coupled to the output of the delay unit, and where the delay unit outputs the same signal to the programmable filter and the spectral modifier.

15. The system of claim 1, where the adder sums the output signal of the programmable filter and the signal received through the discrete input to decrease a first non-periodic signal component in the signal received through the discrete input that is at least partially out of phase with a second non-periodic signal component in the output signal of the programmable filter.

16. The system of claim 1, further comprising:
   a low-pass filter coupled with the spectral modifier, where the low-pass filter and the spectral modifier produce a low-pass filtered and spectrally-modified signal with a spectrally flattened background noise level;
   a high-pass filter coupled with an output of the delay unit; and
   a second adder coupled with an output of the high-pass filter and an output of the low-pass filter, where the second adder adds the low-pass filtered and spectrally-modified signal with an output signal of the high-pass filter to obtain a summed signal at an output of the second adder, and where the output of the second adder is coupled with an input of the adaptive filter.

17. An enhancement speech system that improves the perceptual quality of a processed speech segment, comprising:
   a discrete input;
   a delay unit that digitally delays a discrete signal received through the discrete input;
   a spectral modifier coupled to the delay unit programmed to substantially flatten a portion of the spectral character of a detected background noise;
   an adaptive filter coupled to the spectral modifier that adapts coefficients to match a response to the signal received through the discrete input before the signal is delayed;
   a programmable filter coupled to the delay unit having a transfer function functionally related to a transfer function of the adaptive filter; and
   an adder comprising circuitry, a non-transitory computer-readable storage medium with program instructions stored thereon, or both, where the adder sums an output signal of the programmable filter and the signal received through the discrete input to increase a first periodic signal component in the signal received through the discrete input that is at least partially in-phase with a second periodic signal component in the output signal of the programmable filter, and where the adder amplifies a harmonic structure of the signal received through the discrete input based on the output signal of the programmable filter.

18. The system of claim 17, where the delay unit comprises a programmable delay that delays passing the input signal to the adaptive filter and the programmable filter.

19. The system of claim 17 where the spectral modifier is coupled to a circuit that allows frequencies below a predetermined frequency or frequency range to pass.

20. The system of claim 17, further comprising:
a low-pass filter coupled with the spectral modifier, where the low-pass filter and the spectral modifier produce a low-pass filtered and spectrally-modified signal with a spectrally flattened background noise level;
a high-pass filter coupled with an output of the delay unit; and
a second adder coupled with an output of the high-pass filter and an output of the low-pass filter, where the second adder adds the low-pass filtered and spectrally-modified signal with an output signal of the high-pass filter to obtain the summed signal at an output of the second adder, and where the output of the second adder is coupled with an input of the adaptive filter.

21. The system of claim 17, where the adder sums the output signal of the programmable filter and the discrete signal to decrease a first non-periodic signal component in the discrete signal that is at least partially out of phase with a second non-periodic signal component in the output signal of the programmable filter.

22. A method of enhancing the perceptual quality of a processed speech segment, comprising:
delaying an input signal;
modifying the spectral characteristic of the input signal by substantially flattening the spectral characteristics of a background noise;
adapting the coefficients of a filter to match the response of the input signal;
adapting the coefficients of a programmable filter so that the transfer function of the programmable filter is functionally related to the transfer function of the filter; and
adding an output signal from the programmable filter to the input signal to increase a first periodic signal component in the input signal that is at least partially in-phase with a second periodic signal component in the output signal from the programmable filter.

23. The method of claim 22 further comprising adjusting the gain of the input signal based on the output of the programmable filter.

* * * * *